United States Patent
Merz

(10) Patent No.: US 9,282,630 B2
(45) Date of Patent: Mar. 8, 2016

(54) METHOD OF FORMING A CONFORMAL ELECTROMAGNETIC INTERFERENCE SHIELD

(75) Inventor: Nicholas Merz, San Francisco, CA (US)

(73) Assignee: Apple Inc., Cupertino, CA (US)

(*) Notice: Subject to any disclaimer, the term of this patent is extended or adjusted under 35 U.S.C. 154(b) by 673 days.

(21) Appl. No.: 13/460,400

(22) Filed: Apr. 30, 2012

(65) Prior Publication Data

US 2013/0286609 A1   Oct. 31, 2013

(51) Int. Cl.
*H05K 7/00* (2006.01)
*H05K 1/02* (2006.01)
*C23C 14/08* (2006.01)
*C23C 14/18* (2006.01)
*H05K 3/28* (2006.01)

(52) U.S. Cl.
CPC .......... *H05K 1/0216* (2013.01); *C23C 14/086* (2013.01); *C23C 14/185* (2013.01); *H05K 3/284* (2013.01); *H05K 2201/09872* (2013.01)

(58) Field of Classification Search
USPC .......... 361/816–818, 760–763; 174/350–355, 174/520–529; 29/846–852
See application file for complete search history.

(56) References Cited

U.S. PATENT DOCUMENTS

| | | | |
|---|---|---|---|
| 5,160,374 A * | 11/1992 | Frederickson | C04B 41/009 106/287.19 |
| 7,118,693 B2 | 10/2006 | Glatkowski et al. | |
| 7,202,422 B2 * | 4/2007 | Ogatsu | H05K 3/284 174/373 |
| 7,446,265 B2 | 11/2008 | Krohto et al. | |
| 7,981,730 B2 * | 7/2011 | Tang et al. | 438/124 |
| 8,004,860 B2 * | 8/2011 | Salzman | 361/818 |
| 8,156,644 B2 | 4/2012 | Babb et al. | |
| 8,350,368 B2 | 1/2013 | Chi et al. | |
| 2008/0055878 A1 * | 3/2008 | Salzman | H05K 3/284 361/818 |
| 2009/0242263 A1 * | 10/2009 | Kapusta et al. | 174/350 |
| 2011/0261550 A1 | 10/2011 | Wong et al. | |

* cited by examiner

*Primary Examiner* — Tuan T Dinh
(74) *Attorney, Agent, or Firm* — Joseph F. Guihan

(57) ABSTRACT

Systems and methods for shielding circuitry from interference with conformal coating are disclosed. Systems having conformal EMI shields according to embodiments are provided by applying insulating and conductive layers to areas of a printed circuit board (PCB). This produces systems that may be thinner and also smaller in surface area, and that may be suitable as part of electronic devices.

15 Claims, 8 Drawing Sheets

METHOD OF FORMING A CONFORMAL ELECTROMAGNETIC INTERFERENCE SHIELD

FIELD OF THE INVENTION

This can relate to systems and methods for shielding circuitry from interference and, more particularly, to systems and methods for shielding circuitry from interference with conformal coating.

BACKGROUND OF THE DISCLOSURE

Electromagnetic interference ("EMI") and radio frequency interference ("RFI") are two of the various types of unwanted disturbances that may interrupt, obstruct, or otherwise affect or limit the effective performance of electronic circuitry of electronic devices due to electromagnetic conduction or electromagnetic radiation from an external source. One way to reduce such interference for electronic circuitry is to place electrically conducting metal around the circuitry. For example, an electronic circuit component on a printed circuit board (PCB) is sometimes placed under a metal cover, fence, or can. A possible problem with the foregoing approach is that the metal cover, fence, or can may increase the size of the circuit board and may increase a thickness of an electronic device that includes the circuit board.

SUMMARY OF THE DISCLOSURE

Systems and methods for shielding circuitry from interference with conformal coating are provided.

In some embodiments, a method of forming a conformal electromagnetic interference (EMI) shield may be provided. The method may include processing portions of a printed circuit board (PCB) for insulating layer adhesion. The PCB may include one or more circuit components and a perimeter of grounding contacts. The method may also include applying an insulating layer to the processed portions, treating at least one of the applied insulating layer and the perimeter for conductive layer adhesion, and disposing a conductive layer onto the treated at least one of the applied insulating layer and the perimeter.

In some embodiments, a method for insulating a substrate may be provided. The method may include coupling one or more fence members to a peripheral portion of a substrate. The substrate includes one or more electrical features. The peripheral portion includes grounding contacts about the one or more electrical features. The method may also include applying a first portion of an insulating layer to areas between the coupled fence members and outer surfaces of the one or more electrical features and applying a second portion of the insulating layer on the one or more electrical features.

In some embodiments, a method for insulating a board may be provided. The method may include coupling one or more fence members to a surrounding portion of a board. The board includes one or more board components. The surrounding portion includes grounding lines about the one or more board components. The method also includes applying a conductive foil to top portions of the one or more fence members.

In some embodiments, a system may be provided. The system may include a printed circuit board (PCB). The PCB may include one or more electrical components and a plurality of grounding contacts. The system may also include an insulating layer disposed on the one or more electrical components. The insulating layer is constructed of at least chemical vapor deposition (CVD) Parylene. The system may also include a conductive layer disposed on the insulating layer and the plurality of grounding contacts. The conductive layer is constructed of inkjet printing deposits.

In some embodiments, a system may be provided. The system may include a board. The board may include one or more board components and a plurality of grounding vias. The system may also include an insulating layer disposed on the one or more board components. The insulating layer is constructed of at least chemical vapor deposition (CVD) Parylene. The system may also include a conductive layer disposed on the insulating layer and the plurality of grounding vias. The conductive layer is constructed of physical vapor deposition (PVD) deposits.

In some embodiments, a system may be provided. The system may include a substrate. The substrate may include one or more electrical features and a plurality of grounding lines. The system may also include an insulating layer disposed on the one or more electrical features. The insulating layer is constructed of at least chemical vapor deposition (CVD) Parylene. The system may also include a conductive layer disposed on the insulating layer and the plurality of grounding lines. The conductive layer is constructed of dispensed ink.

In some embodiments, a system may be provided. The system may include a substrate. The substrate may include one or more electrical components, at least one grounding via that is disposed on a perimeter of at least a first electrical component and adjacent to an edge of the substrate, and at least another grounding via that is disposed on the perimeter and adjacent to at least a second electrical component positioned away from the edge. The system may also include an insulating layer that is disposed on the at least a first electrical component and a conductive layer that is disposed on the insulating layer and the perimeter.

In some embodiments, a system may be provided. The system may include a printed circuit board (PCB). The PCB may include one or more circuit components and a plurality of grounding portions. The system may also include an insulating layer that is disposed on at least one circuit component and a patterned conductive layer. The patterned conductive layer may include a first conductive portion that is disposed on at least one portion of the insulating layer and a second conductive portion that is disposed on at least another portion of the insulating layer.

In some embodiments, a method may be provided. The method may include applying an insulating layer to a first portion and a second portion of a printed circuit board (PCB). The method may also include disposing a first conductive layer on a portion of the insulating layer that is applied to the first portion of the PCB. The method may also include disposing a second conductive layer on a portion of the insulating layer that is applied to the second portion of the PCB.

BRIEF DESCRIPTION OF THE DRAWINGS

The above and other aspects and advantages of the disclosure will become more apparent upon consideration of the following detailed description, taken in conjunction with accompanying drawings, in which like reference characters refer to like parts throughout, and in which.

DETAILED DESCRIPTION OF THE DISCLOSURE

Systems and methods for shielding circuitry from interference with conformal coating are provided and described with reference to FIGS. 1-9.

Figure 1A:
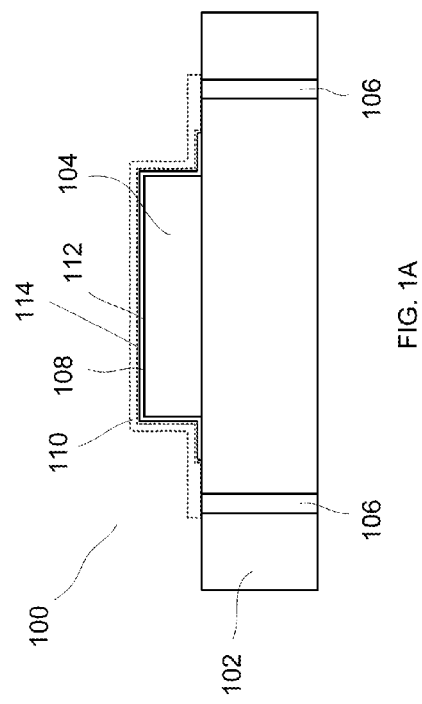
FIG. 1A shows an illustrative system having a conformal EMI shield in accordance with an embodiment.

FIG. 1A shows an illustrative system having a conformal EMI shield in accordance with an embodiment. System 100 may be included as a part of an electronic device such as, for example, a portable media player, a smart phone, a laptop computer, or a tablet. System 100 may include PCB 102 having one or more circuit components 104. PCB 102 may be a central or primary printed circuit board, and may also be known as a main circuit board, motherboard, mainboard, baseboard, system board, planar board, or logic board. PCB 102 may provide one or more attachment points to each one of circuit components 104. Generally, most of the basic circuitry and components required for an electronic device to function may be onboard or coupled (e.g., via one or more cables, bond pads, leads, terminals, cables, wires, contact regions, etc.) to PCB 102. Such circuit component 104 may include one or more chipsets or specialized groups of integrated circuits. For example, PCB 102 may include two components or chips, such as a Northbridge and Southbridge, although in other embodiments, these chips may be combined into a single component. Each one of circuit components 104 can also be one of various other types of components, including, but not limited to, a processor, memory, power supply, communications circuitry, input component, output component, and combinations thereof.

System 100 may also include a plurality of grounding contacts 106 along a perimeter of circuit component 104. Grounding contacts 106 may be constructed of any suitable material (e.g., any conductive material) and may include pads or vias that may be coupled to a ground plane (not shown) of PCB 102. Although only one circuit component 104 and one perimeter of grounding contacts 106 may be shown, it should be appreciated that PCB 102 may include a plurality of circuit components 104, each of which may be surrounded with a respective perimeter of grounding contacts 106, or two or more of which may be surrounded, as a group, with a perimeter of grounding contacts 106.

System 100 may also include insulating layer 108 on circuit component 104 and at least a portion of PCB 102. Insulating layer 108 may be constructed of any suitable material (e.g., any non-conductive material or material with low conductivity) so as to form an insulating layer over circuit component 104, and may have any suitable thickness (e.g., 0.5 μm to 300 μm).

System 100 may also include conductive layer 110 on insulating layer 108. Conductive layer 110 may be constructed of any suitable material (e.g., any conductive material having any suitable conductivity) and have any suitable thickness. Portions of conductive layer 110 may be coupled to grounding contacts 106 so as to form a conductive shield.

In some embodiments, system 100 may also include insulating layer adhesive 112 that may be disposed on circuit 104, and upon which insulating layer 108 may be disposed. Insulating layer adhesive 112 may be disposed on circuit component 104 (or on any suitable portion of PCB 102) as part of treating PCB 102 for applying insulating layer 108. Insulating layer adhesive 112 may be constructed of or formed via any suitable material (e.g., plasma, silicon, etc.). In some embodiments, the PCB may be treated using a solvent (e.g., Silane), that may modify treated surfaces of the PCB (e.g., to improve adhesion properties) and evaporate. In these embodiments, insulating layer adhesive 112 may not be a separate material, but may simply be a characteristic of the treated surfaces of the PCB.

In some embodiments, system 100 may also include conductive layer adhesive 114 that may be disposed on circuit 104, and upon which conductive layer 110 may be disposed. Conductive layer adhesive 114 may be disposed on insulating layer 108 and grounding contacts 106 (and/or on any other suitable portion of PCB 102) as part of treating PCB 102 for applying conductive layer 110. Conductive layer adhesive 110 may be constructed of or formed via any suitable material (e.g., plasma, UV ozone, solder, etc.). In some embodiments, insulating layer 108 and grounding contacts 106 may be treated (e.g., via UV ozone, plasma, etc.), that may modify treated the surfaces (e.g., to improve adhesion properties) and evaporate. In these embodiments, conductive layer adhesive 114 may not be a separate material, but may simply be a characteristic of the treated surfaces.

For simplicity of description, the combination of an insulating layer (e.g., insulating layer 108) and a conductive layer (e.g., conductive layer 110) will be referred to hereafter as a conformal EMI shield. Some conformal EMI shields are discussed in more detail in commonly assigned U.S. Pat. No. 8,071,893, issued on Dec. 6, 2011, and entitled "METHODS AND APPARATUS FOR SHIELDING CIRCUITRY FROM INTERFERENCE," and U.S. Patent Application Publication No. 2011/0085316, published on Apr. 14, 2011, and entitled "CONFORMING EMI SHIELDING," both of which are incorporated by reference herein in their entireties.

In some embodiments, system 100 may be constructed to ensure shielding of circuit component 104 at critical frequencies of EMI (e.g., 0.7 GHz to 6 GHz), meet minimum system reliability specifications and minimum design for manufacturing (DFM) processing and yield specifications. For example, the perimeter of grounding contacts 106 may be spaced a minimum predefined distance (e.g., 3 mm) from an outer surface of circuit component 104 and/or any other circuit component (not shown) that may be outside of, but adjacent to the perimeter.

A conventional PCB assembly (PCBA) typically requires extra surface area to accommodate conventional metal cover, fence, or can shields, which may result in a thicker PCBA and a thicker electronic device that may include the PCBA. With conformal EMI shielding, a PCBA (and product that may include the PCBA) may be made smaller in terms of surface area and thickness, which may also allow more circuit components to be included in the PCBA.

Figure 1B:
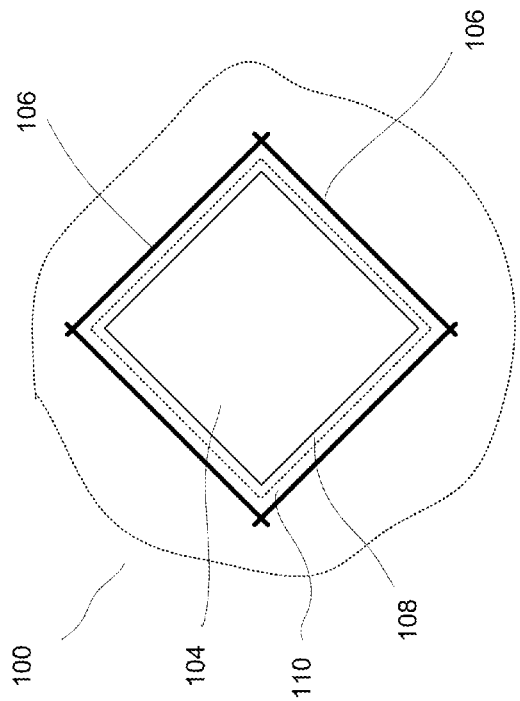
FIG. 1B is a top partial view of an illustrative system having a conformal EMI shield in accordance with an embodiment.

Although FIG. 1A may appear to show that only some sides of circuit component 104 may be conformally EMI shielded (e.g., by insulating layer 108 and conductive layer 110), an entire perimeter or boundary of circuit component 104 may be conformally EMI shielded. FIG. 1B is a top partial view of an illustrative system having a conformal EMI shield in accordance with an embodiment. As shown in FIG. 1B, insulating layer 108 may be completely disposed over circuit component 104, and conductive layer 110 may be completely disposed over insulating layer 108 (and thus, circuit component 104). Additionally, end portions of conductive layer 110 may be coupled to the perimeter of grounding contacts 106.

Figure 1C:
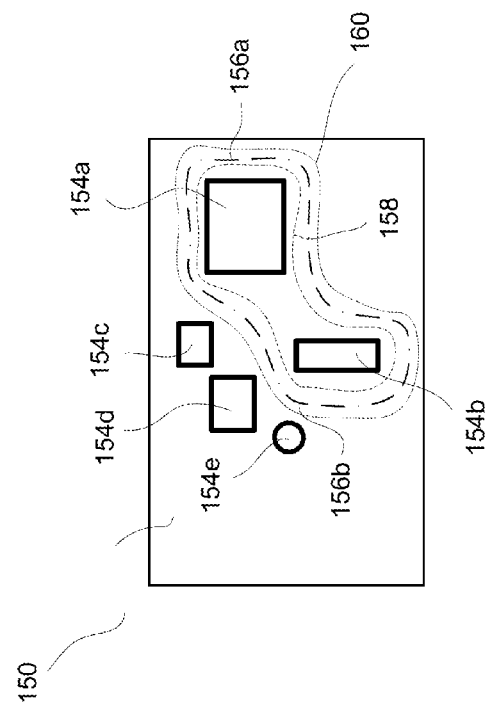
FIG. 1C shows an illustrative irregularly shaped system having a conformal EMI shield in accordance with an embodiment.

In some embodiments, a PCB may include conformal EMI shields having any suitable shape (e.g., symmetrical, irregular, etc.). FIG. 1C shows an illustrative irregularly shaped system having a conformal EMI shield in accordance with an embodiment. System 150 may be similar to system 100, but may include a conformal EMI shield having an irregular shape. System 150 may include PCB 152 having circuit components 154*a*, 154*b*, 154*c*, 154*d*, and 154*e*. Components 154*c*, 154*d*, and 154*e* may or may not be EMI shielded. System 150 may include a perimeter of grounding contacts 156*a* and 156*b* about circuit components 154*a* and 154*b*. As shown in FIG. 1C, grounding contacts 156*a* may be adjacent to an edge of PCB 152, and grounding contacts 156*b* may be interlaced between circuit components (e.g., between shielded circuit components 154*a* and 154*b* and unshielded circuit components 154*c*, 154*d*, and 154*e*) within an internal region of PCB 152.

Insulating layer 158 may be disposed on circuit components 154*a* and 154*b*, and conductive layer 160 may be disposed over insulating layer 158 and coupled to grounding contacts 156*a* and 156*b*, forming an irregularly shaped conformal EMI shield. With the perimeter of grounding contacts 156*a* disposed close to an edge of PCB 152 and with grounding contacts 156*b* interlaced between various circuit components, a surface area of PCB 152 may be made smaller and a conformal EMI shield may have any suitable shape (e.g., a non-symmetrical shape).

Figure 2:
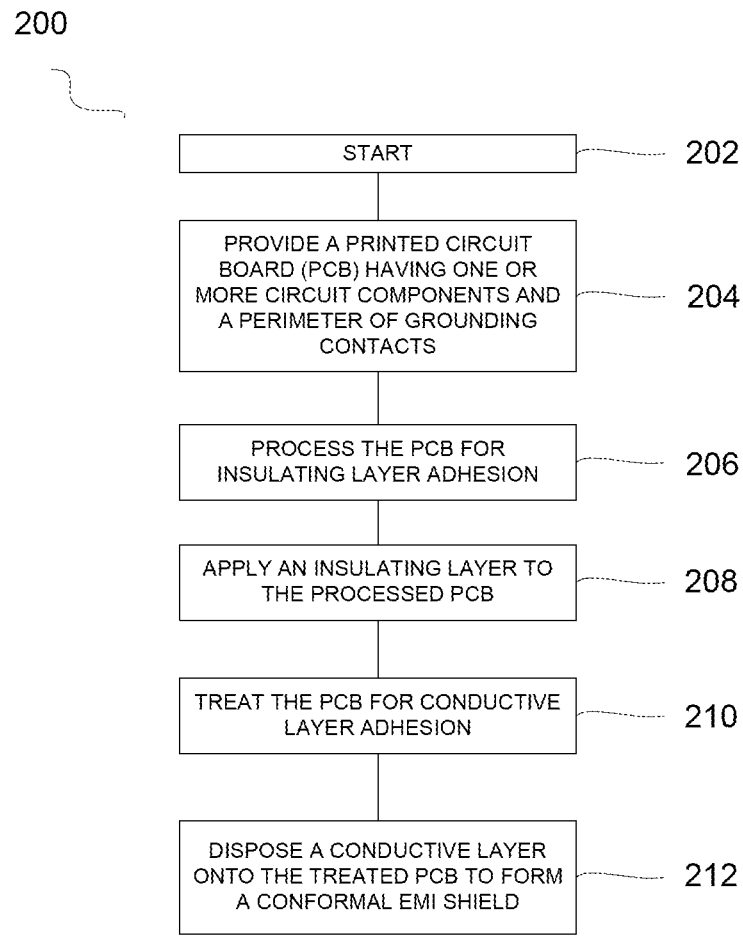
FIG. 2 shows an illustrative process for conformal shielding a PCB in accordance with an embodiment.

FIG. 2 shows an illustrative process for conformal shielding a PCB in accordance with an embodiment. Process 200 may begin at step 202. At step 204, the process may include processing portions of a PCB (e.g., PCB 102) for insulating layer adhesion. The PCB may include one or more circuit components (e.g., circuit component 104) and a perimeter of grounding contacts (e.g., grounding contacts 106) that may be coupled to a ground plane of the PCB. The PCB may be designed and fabricated according to various specifications and requirements, and may be provided with grounding contacts disposed along a perimeter of at least one circuit component, forming an outline of areas on the PCB to be EMI shielded. The perimeter may be set such that the grounding contacts are at least a minimum distance (e.g., 3 mm) away from an outer surface of the at least one circuit component, in order to satisfy EMI shielding requirements at particular frequencies (e.g., 6 GHz noise). The ground plane of the PCB may be formed by stitching, the edge of the PCB may be plated, and/or the surface of the PCB may be mounted with ground pads. In addition, the PCB may be tested per standard board assembly processed.

In some embodiments, step 204 may include applying an inter-layer adhesive or an insulating layer adhesive to portions of the PCB such that an insulating layer may subsequently be applied for shielding. For example, step 204 may include applying insulating layer adhesive 112 within the perimeter of the grounding contacts and over the circuit component (and/or any other critical for functioning electrical areas of the PCB) such that insulating layer 108 may subsequently be applied for shielding. In other embodiments, step 204 may include applying an insulating layer adhesive to a circuit component and within a perimeter of groundings contacts. This may allow grounding contacts to be exposed for later coupling to a conductive layer (e.g., conductive layer 110). In yet other embodiments, step 204 may include applying an insulating layer adhesive over a circuit component to beyond the perimeter. In these embodiments, a subsequent removal process may be performed to remove any insulating layer adhesive that may be disposed on the grounding contacts.

In some embodiments, instead of applying an actual layer of insulating layer adhesive, portions of the PCB may be treated to promote adhesive properties on the processed portions. As an example, step 204 may include subjecting portions of the PCB to at least a minimum of eight (8) minutes of UV ozone treatment or plasma treatment at 600 kW for a minimum of 30 seconds. As another example, step 204 may include treating the PCB (e.g., one or more circuit components within the perimeter of grounding contacts) with plasma or other comparable material. The plasma may activate the treated surfaces such that an insulating layer may adhere, couple, or bond to the treated surfaces. For example, plasma may be used to treat the PCB prior to insulating via local potting with fence, conformal spray coating, and dam and fill potting.

In some embodiments, the insulating layer may be constructed of CVD-applied polymer or other comparable material. In these embodiments, the insulating layer adhesive may include a silicon material, which may be suitable for bonding or coupling to CVD-applied polymer. For example, step 204 may include treating the PCB (e.g., one or more circuit components within the perimeter of grounding contacts) with Silane prior to the application of the insulating layer.

At step 206, the process may include applying an insulating layer to the processed portions. For example, step 206 may include applying insulating layer 108 to the insulating layer adhesive. In some embodiments, step 206 may include applying the insulating layer to completely cover (e.g., over the insulating layer adhesive) the circuit component and/or areas of the PCB critical for functioning (e.g., electrical areas). For example, step 206 may include applying the insulating layer completely within the perimeter of grounding contacts. In this manner, the grounding contacts may be left exposed for later coupling with a conductive layer. In other embodiments, step 206 may include applying the insulating layer over the circuit component to beyond the perimeter, and a subsequent removal process may be performed to remove any insulating layer portions that may be disposed on the perimeter (e.g., prior to applying or creating a conductive layer adhesive and/or a conductive layer).

At step 208, the process may include treating at least one of the applied insulating layer and the perimeter for conductive layer adhesion. For example, step 208 may include applying a conductive layer adhesive (e.g., conductive layer adhesive 114) to at least one of the applied insulating layer and the perimeter of grounding contacts, such that a conductive layer (e.g., conductive layer 110) may subsequently be applied over the circuit component to be shielded.

In some embodiments, instead of applying an actual layer of conductive layer adhesive, step 208 may include treating at least one of the insulating layer and the perimeter with plasma or other comparable material. The plasma may activate the treated surfaces such that a conductive layer may adhere, couple, or bond to the treated surfaces. For example, step 208 may include treating at least one of the insulating layer and the perimeter at 600 kW for a minimum of 30 seconds prior to disposing a conductive layer that may be constructed via PVD.

In some embodiments, the conductive layer may be constructed of inkjet printing deposits or other comparable material. In these embodiments, the conducting layer adhesive may be formed based on UV ozone treatment, which may be suitable for bonding or coupling to inkjet printing deposits. For example, step 208 may include treating at least one of the insulating layer and the perimeter with UV ozone prior the application of the conductive layer.

In some embodiments, the conductive layer may include a foil that may easily be coupled or bonded to the grounding contacts (e.g., directly or via an intervening conductive member such as a fence part) via a hot bar soldering process. Thus, in these embodiments, the conductive adhesive material may simply include one or more types of solder.

At step 210, the process may include disposing a conductive layer onto the treated at least one of the applied insulating layer and the perimeter. For example, the process may include applying conductive layer 110 to conductive layer adhesive 114 to partially or completely cover the perimeter of grounding contacts and/or the applied insulating layer. In some embodiments, step 210 may include applying the conductive layer only to the grounding contacts and the insulating layer.

One or more of steps 202, 204, 206, 208, and 210 may be performed by automated machinery in a controlled environment. It is understood that some steps of process 200 may be deleted and additional steps may be added without departing from the spirit of the disclosure. For example, the steps for creating a conformal EMI shield may vary depending on a type of insulating layer, a manner of application thereof, a type of conductive layer, and a manner of application thereof.

Figure 3A:
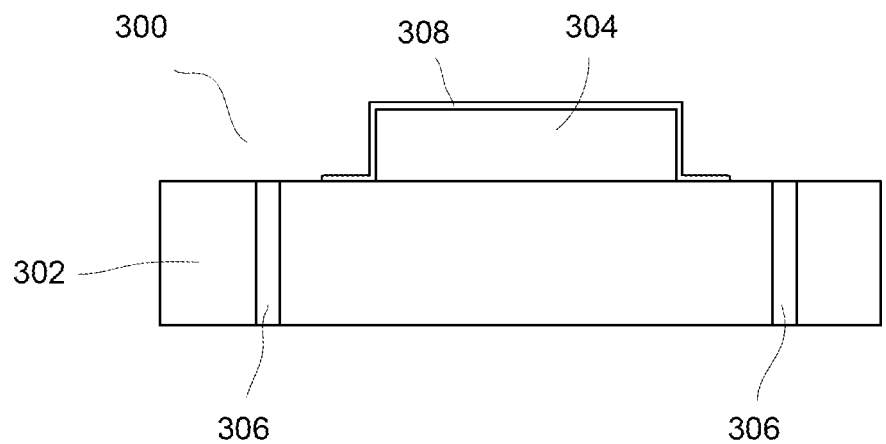
FIG. 3A shows an illustrative system having an insulating layer as part of a conformal EMI shield in accordance with an embodiment.

FIG. 3A shows an illustrative system 300 having an insulating layer as part of a conformal EMI shield in accordance with an embodiment. System 300 may be similar to system 100 and may include PCB 302, circuit component 304, a perimeter of grounding contacts 306, and insulating layer 308. Insulating layer 308 may include one or more conformal coating materials (e.g., Humiseal 131B, Humiseal 1A33/thinner 521, Humiseal UV40-250, Henkel PC40-UM, Henkel 7993, etc.) that may be applied (e.g., sprayed or dispensed) via coating spray equipment (e.g., a PVA dispense machine or an Asymeteck spray machine). For example, as part of processing a PCB (e.g., similar to step 206 described above with reference to FIG. 2), a mask may be applied to the PCB 302 to cover grounding contacts 306 and other areas of PCB 302 that are not to be shielded. For example, the mask may be three-dimensional in shape. Then, as part of applying an insulating layer (e.g., similar to step 208 described above with reference to FIG. 2), conformal coating materials may be applied (e.g., sprayed or dispensed) to the entirety of PCB 302 (e.g., using coating spray equipment), and may be subsequently cured to form the insulating layer 308. The mask may then be removed, where the masked areas may be left exposed for conductive layer adhesion. By employing conformal spray or dispensed coating, the thickness of a resulting conformal EMI shield may be reduced to merely the thickness of the insulating layer and the conductive layer, and the shield perimeter may be reduced to the perimeter of the grounding contacts. In some embodiments, fluorine may be added to the coating material to improve hydrophobicity. Other advantages of this may include, for example, better adhesion, better metallization, easier masking, better process control and/or cycle time, and better recipes.

In some embodiments, in order to keep grounding contacts or pads exposed during masking, solder stencil may be modified, and solder flux may need to be cleaned thoroughly (e.g., IPA). A masking fixture may also need to be accurate and aligned, to allow for better than +/−0.20 mm for small components near edges. The masking fixture may also need to be silicone to de-wet coating at a contact point. Further, in some embodiments, plasma treatment of the PCB prior to spray coating may be employed. In other embodiments, no plasma treatment may be employed.

Figure 3B:
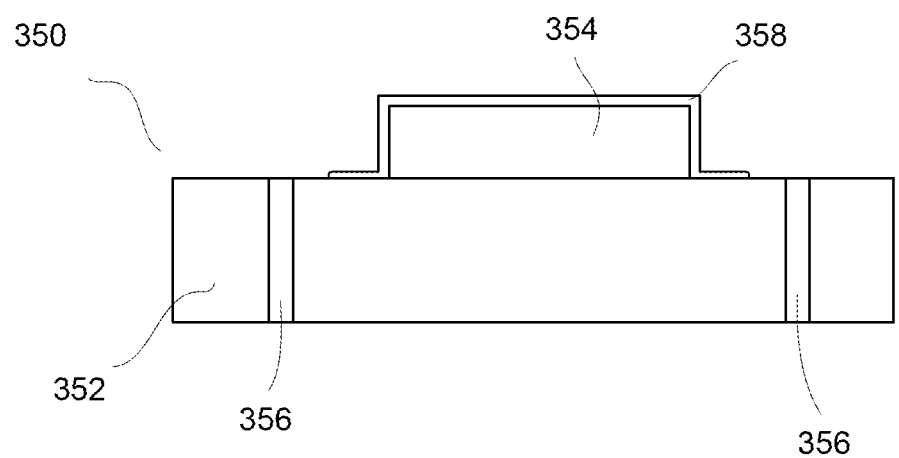
FIG. 3B shows an illustrative system having an insulating layer as part of a conformal EMI shield in accordance with an embodiment.

FIG. 3B shows an illustrative system having an insulating layer as part of a conformal EMI shield in accordance with an embodiment. System 350 may be similar to system 100 and may include PCB 352, circuit component 354, a perimeter of grounding contacts 356, and insulating layer 358. Insulating layer 358 may include a thin (e.g., microns) layer of protective and insulating material (e.g., Kisco Parylene-N, etc.) that may be applied via Chemical Vapor Deposition (CVD). For example, as part of processing a PCB (e.g., similar to step 206), a mask may be applied to PCB 352 to cover grounding contacts (e.g., grounding contacts 356) and other areas of PCB 352 that are not to be shielded. The type of the applied mask and a manner of applying thereof may vary depending on the insulating material being applied by CVD. In particular, if Parylene-N is used as the insulating layer, extensive masking may be required to ensure that connectors and/or pins of the PCB, that are not to be insulated, are well masked from potential intrusive qualities of Parylene-N. For example, the mask may be constructed of Kapton tape, dispensed silicone gasket material, tape with beads of silicon disposed around the tape, or any other suitable type of material (e.g., silicon). A clamp (e.g., 3 block clamp) may be employed to keep the mask in position. In some embodiments, connectors and/or pins may be masked by heat to prevent Parylene from coupling to the pins. After applying the insulating layer, the mask may then be removed (e.g., manually), where the masked areas may be left exposed for conductive layer adhesion. Then, as part of applying an insulating layer (e.g., similar to step 208), Chemical Vapor Deposition (CVD) may be performed to apply a thin (e.g., microns) layer of protective and insulating material (e.g., Kisco Parylene-N, etc.) to the entirety of the PCB to form the insulating layer (e.g., insulating layer 358). By employing conformal spray or dispensed coating, the thickness of a resulting conformal EMI shield may be reduced to merely the thickness of the insulating layer and the conductive layer, and the shield perimeter may be reduced to the perimeter of the grounding contacts. At least one advantage of CVD-applied polymer is that it may provide hydrophobic protection to the PCB.

Figure 4A:
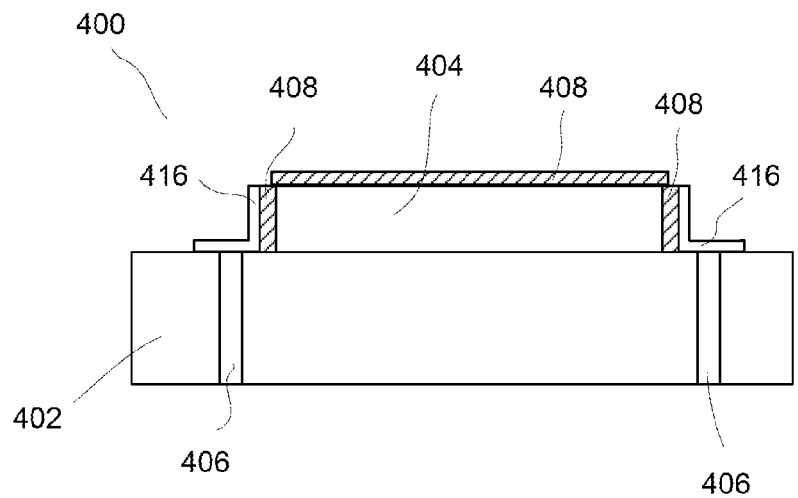
FIG. 4A shows an illustrative system having an insulating layer as part of a conformal EMI shield in accordance with an embodiment.

FIG. 4A shows an illustrative system having an insulating layer as part of a conformal EMI shield in accordance with an embodiment. System 400 may be similar to system 100 and may include PCB 402, circuit component 404, a perimeter of grounding contacts 406, and insulating layer 408. System 400 may also include fences 416 that may be coupled to grounding contacts 406. Insulating layer 408 may include potting material having low viscosity (e.g., Henkel 3311, Henkel 1072/1061, Henkel 3705/9060, Henkel 3311, Dymax 9-20557, Dymax 94-B/29986, Panacol 1671, and Panacol 2009F) that may fill areas between fences 416 and an outer surface of circuit component 404. For example, any conductive areas within fences 416 (e.g., a part of circuit component 404 or portions of PCB 402 coupled to circuit component 404) may be sealed with the potting material. By employing fences, a thickness of a resulting EMI shield may be reduced to merely a thickness of the conductive layer.

Figure 4B:
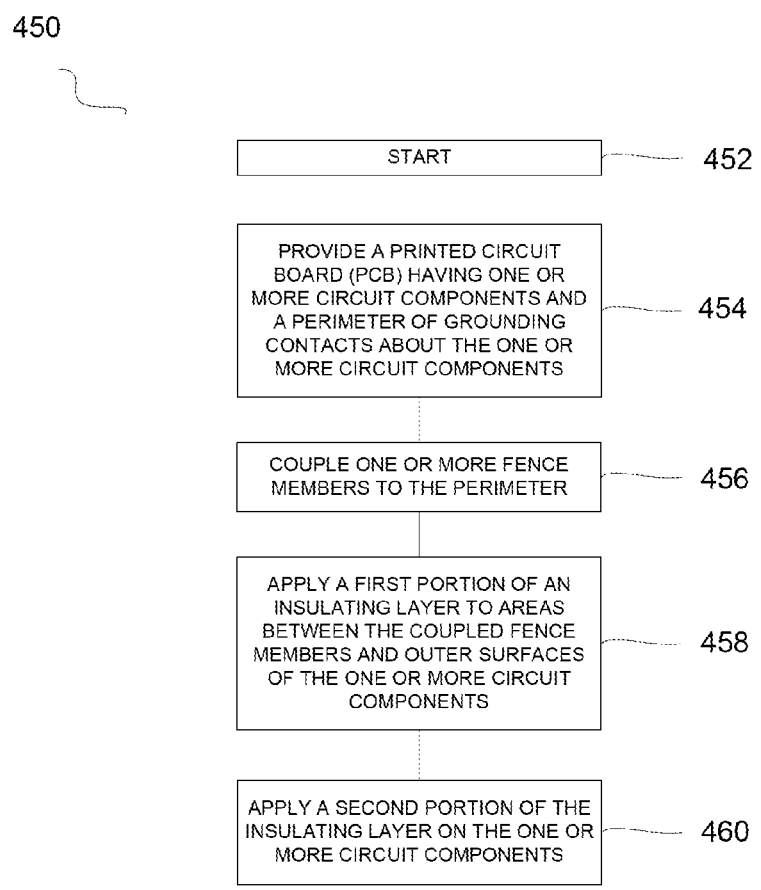
FIG. 4B shows an illustrative process for applying an insulating layer to a PCB in accordance with an embodiment.

FIG. 4B shows an illustrative process for applying an insulating layer to a PCB in accordance with an embodiment. Process 450 may begin at step 452. At step 454, the process may include coupling one or more fence members to a peripheral portion of a substrate. The substrate may include one or more electrical features, and the peripherals portion may include grounding contacts about the one or more electrical features. For example, step 454 may include coupling one or more fence members 416 to grounding contacts 406 of PCB 402. At step 456, the process may include applying a first portion of an insulating layer to areas between the coupled fence members and outer surfaces of the one or more electrical features. For example, step 456 may include applying (e.g., via a PVA dispense machine) a portion of insulating layer 408 (e.g., potting material such as Henkel 3311) between fence members 416 and outer surfaces of circuit component 404 in order to seal any conductive areas that may exist within the fence members (e.g., a part of circuit component 404 or portions of PCB 402 coupled to circuit component 404). At step 458, the process may include applying a second portion of the insulating layer on the one or more electrical features. For example, step 458 may include applying another portion of insulating layer 408 on circuit component 404 to form an insulating shield. In some embodiments, the fence members may need to be completely solid on sidewalls, and may need to be used in combination with medium or high viscosity potting components.

In some embodiments, a dam and fill dispensing technique may be employed to insulate one or more circuit components of a PCB (e.g., as described in more detail in U.S. Pat. No. 8,071,893). For example, as part of processing a PCB (e.g., similar to step 206), high viscosity material may be applied to create a dam within a perimeter of grounding contacts (e.g., grounding contacts 106). The high viscosity material may include, for example, Henkel 3705 or Panacol 1671. Then, as part of applying an insulating layer (e.g., similar to step 208), a low viscosity material may be potted within the dam (e.g., between the dam and an outer surface of one or more circuit components such as circuit component 104). The low viscosity material may include, for example, Henkel 3311 or Panacol 2009. In this manner, any conductive material (e.g., a part of circuit component 104 or portions of PCB 102 coupled to circuit component 104) that may exist within the dam.

In some embodiments, an adhesive film may be used as an insulating layer for a conformal EMI shield (e.g., as described in more detail in U.S. Patent Application Publication No. 2011/0085316). For example, as part of applying an insulating layer (e.g., similar to step 208), an adhesive film may be die-cut to a shape that may be smaller than a perimeter of grounding contacts of a PCB (e.g., grounding contacts 106 of PCB 102). The adhesive film may include, for example, Threebond 1630. The die-cut film may be formed directly onto one or more circuit components of the PCB (e.g., circuit component 104 of PCB 102) via vacuum and heat, and may be subsequently cured with heat and/or UV light in order to form an insulating layer (e.g., insulating layer 108).

Figure 5:
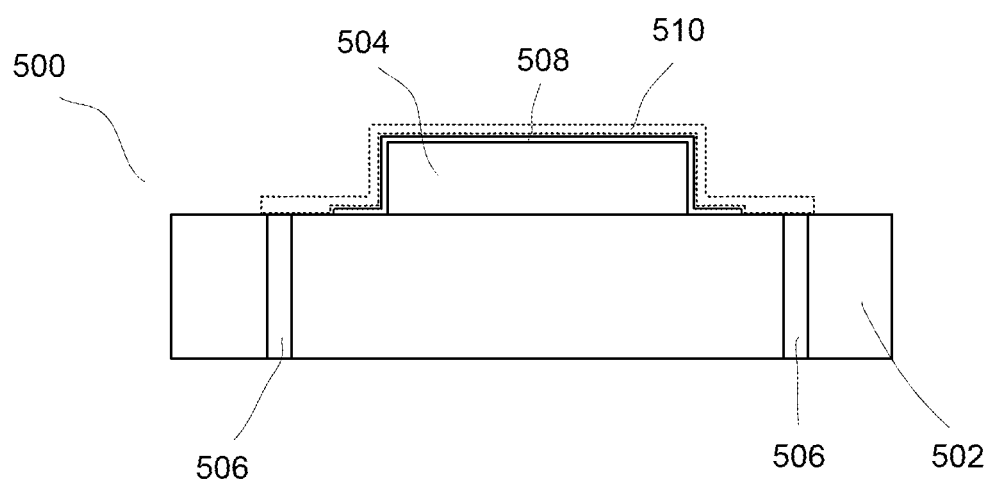
FIG. 5 shows an illustrative system having a conductive layer as part of a conformal EMI shield in accordance with an embodiment.

FIG. 5 shows an illustrative system having a conductive layer as part of a conformal EMI shield in accordance with an embodiment. System 500 may be similar to system 100 and may include PCB 502, circuit component 504, a perimeter of grounding contacts 506, insulating layer 508, and conductive layer 510. Conductive layer 510 may include a thin (e.g., hundreds of nanometers) layer of metal (e.g., Aluminum (Al), Copper (Cu), Silver (Au), Gold (Ag), etc.) that may be applied via PVD to at least exposed grounding contacts 506 and areas of PCB 502 that are to be shielded (e.g., insulating layer 508). For example, conductive layer 510 may include 100 nm of chrome or 350 nm of copper. As part of processing a PCB (e.g., similar to step 206), for example, a mask may be applied to the PCB (e.g., PCB 502) to cover areas of the PCB that are not to be shielded, while leaving exposed grounding contacts (e.g., grounding contacts 506) and other areas that are to be shielded (e.g., insulating layer 508). Further, a conductive layer adhesive (e.g., 100 nm chrome) may be applied over the insulating layer (or may result based on treatment of the insulating layer) to promote conductive layer adhesion. Then, as part of applying a conductive layer (e.g., similar to step 212), Physical Vapor Deposition (PVD) may be performed to apply a thin (e.g., hundreds of nanometers) layer of metal (e.g., Aluminum (Al), Copper (Cu), Silver (Au), Gold (Ag), etc.) to at least the exposed grounding contacts and the areas of the PCB that are to be shielded. For example, 350 nm of copper may be applied via PVD. In some embodiments, an extra layer of chrome may subsequently be applied on the conductive layer (e.g., to promote copper adhesion, to prevent cracking of the copper, etc.). As an alternative to, or in addition to, disposing the conductive layer via PVD, a heat torching technique, ionic bombardment (e.g., via a suitable machine gun), sublimation, sputtering, and arc (e.g., spraying) techniques may also be employed to form the conductive layer. Via some of these techniques, magnetic fields may be used to control the flow of particles.

In some embodiments, potting material may need to be fully cured prior to PVD to prevent potential gassing and bubbling during PVD in a PVD vacuum chamber. Further, SiO2 and Nataco-3WAB may also be employed as adhesion promoters (e.g., for conductive layer thickness below 350 nm).

In some embodiments, conductive layer 510 may instead include a thin layer (e.g., microns) of nano-particle silver ink (e.g., Cabot CCI-300) may be printed onto exposed grounding contacts and other areas that are to be shielded. For example, as part of applying a conductive layer (e.g., similar to step 212), a thin layer (e.g., microns) of nano-particle silver ink (e.g., Cabot CCI-300) may be printed onto exposed grounding contacts (e.g., grounding contacts 506) and other areas of a PCB (e.g., PCB 502) that are to be shielded (e.g., insulating layer 508). The nano silver ink may be coated in plastic, for example. The printed ink may then be cured to create a continuous conductive shield. Advantages of creating conformal EMI shields using inkjet printing include not requiring masking of the PCBA after the application of the insulating layer, and the ability to produce precise and complex shield work. In some embodiments, inkjet printing may not provide conductive layer coverage to side or vertical walls of components to be shielded. However, inkjet printing may be tailored to fine tune shield coverage by, for example, locally spraying extra material in areas of shadow (e.g., vertical walls of components that cannot be reached by vertical application of material). Additionally, inkjet printing may allow for shields with hole patterns of a minimum size for effectively blocking EMI, thus saving on materials and cost.

In some embodiments, Cabot CCI-300 ink may be inkjet printed on a PCBA that may be treated with a variety of substrates. The inkjet printing resolution may, for example, be 1270 dpi on DMP2800, via a 10 pL Cartridge 6-7 pL. The PCBA may be pretreated with UV ozone (e.g., which may provide adequate wetting) and, subsequent curing of the printed ink may be performed at, for example, 130° C. for 15 min. Instead of UV ozone treatment, in some embodiments, plasma treatment may be employed.

In some embodiments, conductive layer 510 may instead include a thick layer (e.g., 25 microns minimum thickness) of large-flake silver ink (e.g., Henkel PD-004A) that may be dispensed (e.g., spray painted) over exposed grounding contacts 506 and other areas of PCB 502 that are to be shielded. As part of processing a PCB (e.g., similar to step 206), for example, a mask may be applied to the PCB (e.g., PCB 502) to cover areas of the PCB that are not to be shielded, while leaving exposed grounding contacts (e.g., grounding contacts 506) and other areas that are to be shielded (e.g., insulating layer 508). For example, silicone may be deposited to mask the areas not to be shielded. As part of applying a conductive layer (e.g., similar to step 212), a thick layer (e.g., 25 microns minimum thickness) of large-flake silver ink (e.g., Henkel PD-004A) may be dispensed, for example, using a coaxial air and agitation assisted jet dispensing apparatus (e.g., Asymtek S-900 with DJ-2200 valve, 30 ga needle, narrow beat air cap, peristaltic pump attachment) over exposed grounding contacts (e.g., grounding contacts 506) and other areas of a PCB (e.g., PCB 502) that are to be shielded. The parameters may include fluid at 15 psi, coax at 5 psi, and pre-load micrometer at 3 turns/0.3 (e.g., 30 increments). In some embodiments, the ink may need to be circulated constant to prevent damage to the pump (e.g., 1 hour or more dwelling may damage the pump). The dispensed ink may then be cured with UV light and/or heat. Advantages of creating conformal EMI shields using dispensed ink include not requiring masking of the PCBA after the application of the insulating layer, the same equipment may be used to apply both the insulating layer and the dispensed ink, and the ability to produce precise and complex shield work.

Figure 6A:
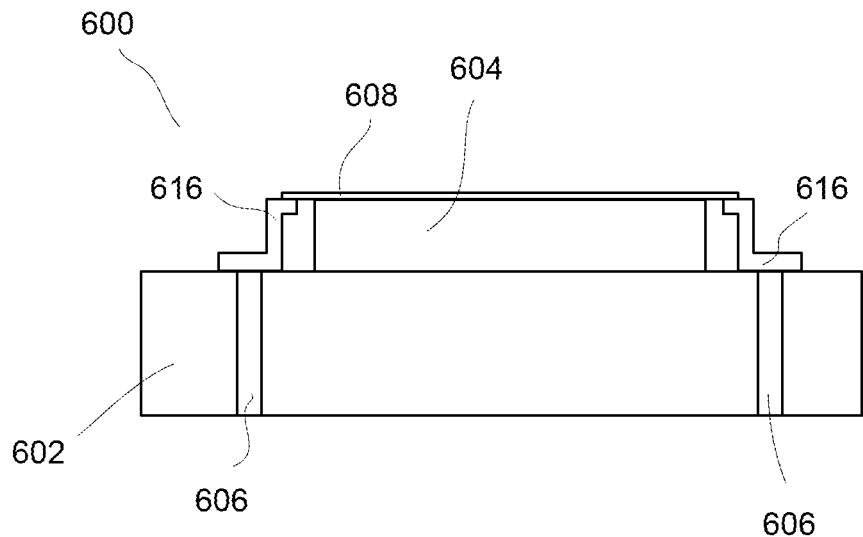
FIG. 6A shows an illustrative system having a conductive layer as part of a conformal EMI shield in accordance with an embodiment.

FIG. 6A shows an illustrative system having a conductive layer as part of a conformal EMI shield in accordance with an embodiment. System 600 may be similar to system 100 and may include PCB 602, circuit component 604, a perimeter of grounding contacts 606, fence members 616, and conductive layer 610. Fence members 616 may be coupled to grounding contacts 606. Conductive layer 608 may include a thin film and may be disposed on top portions of fence members 616.

Figure 6B:
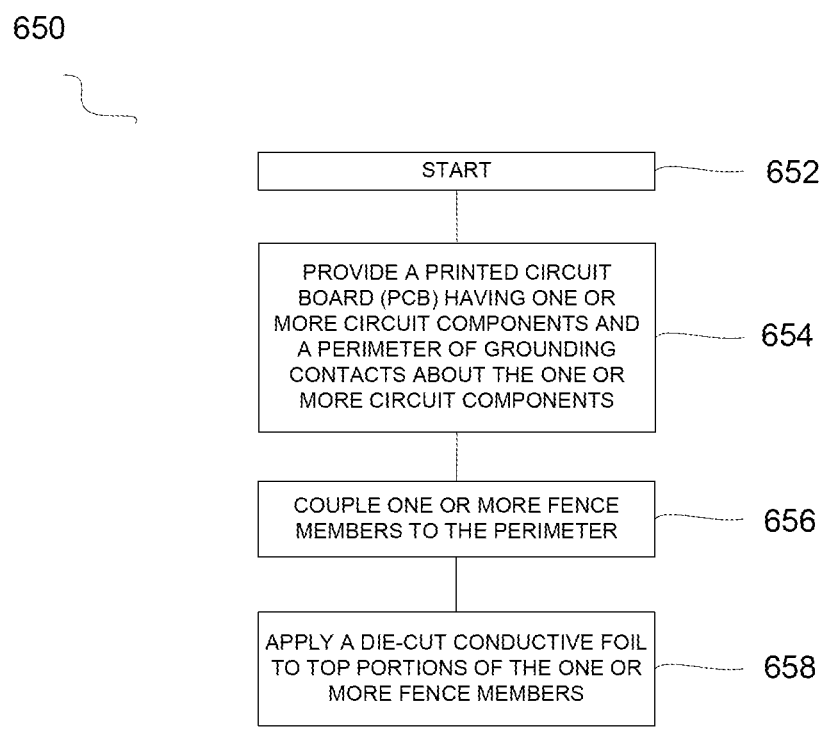
FIG. 6B shows an illustrative process for applying a conductive layer to a PCB in accordance with an embodiment.

FIG. 6B shows an illustrative process for applying a conductive layer to a board in accordance with an embodiment. Process 650 may begin at step 652. At step 654, the process may include coupling one or more fence members to a surrounding portion of a board. The board may include one or more board components, and the surrounding portion may include grounding lines about the one or more board components. For example, step 654 may include coupling one or more fence members 616 to grounding contacts 606 of PCB 602. At step 656, the process may include applying a conductive foil to top portions of the one or more fence members. For example, step 654 may include applying conductive layer 608 on circuit component 604 to form a conductive shield.

It should be appreciated that any combination of one or more of insulating layers (or any other suitable insulating layer) with one or more of conductive layers (or any other suitable conductive layer) may be made. Various respective manners of application of the insulating and conductive layers may also be employed. Additionally, the PCB may be configured in any suitable manner prior to the application of the insulating and conductive layers. For example, the PCB may include no shields installed, no NAND area shield installed (but all other shields being standard), a modified shield fence around NAND areas (and all other shields standard), and a standard MP board that is run through a PVD chamber.

The application of the insulating layer may include, for example, conformal spraying of Humiseal 1B33EPA/604, dam & fill with Panacol 1671/2009, dam & fill with Henkel 3705/33111, CVD Parylene N, and laminating with ThreeBond TB1613. The application of the conductive layer may include, for example, PVD Cr—Cu—Cr (e.g., chrome, then copper, then chrome), inkjet printing Cabot CCI-300, dispensing Henkel PD-004A, manual application of Tatsuto SF-PC3100, hotbar with Tatsuto SF-PC3100, and dispensing epoxy grids.

In some embodiments, the insulating layer may be formed using spray conformal coating techniques (e.g., of Humiseal 131B) and the conductive layer may be constructed via PVD.

In some embodiments, the insulating layer may be constructed of CVD Parylene and the conductive layer may be constructed of dispensed ink.

In some embodiments, Parylene may be used to form the insulating layer of a conformal EMI shield, and PVD applied material may be used for the conductive layer. Parylene, which may be fluorinated, may involve a process of converting monomers to dimers, and then from dimers to polymers. In these embodiments, a process similar to process 200 may be used to provide a conformal EMI shield.

Such a process may include processing a PCB. For example, the process may include applying Kapton, silicone, and/or vacuum friendly tape to mask components and areas of the PCB not to be shielded. As another example, the process may include spraying Silane (e.g., Momentive Silquest A-174NT) onto the PCB, and then dispensing or applying silicone to mask the areas not to be shielded. The mask may be applied manually or using an X-Y table.

The process may also include applying an insulating layer. For example, the process may include applying Parylene via CVD onto the processed PCB (e.g., in a vacuum environment). For example, the process may include applying Parylene gas, liquid, and/or a combination of gas and liquid precursors (e.g., each having high or low molecular weights) to the masked PCB. In some embodiments, a minimum of 5 microns (or between 5 and 25 microns) of Parylene may be applied. The application of Parylene may take approximately 30 minutes to 4 hours, for example. A CVD vacuum chamber (e.g., a $10^{-5}$ Torr vacuum) may also be employed as part of the applying.

The process may also include demasking the PCB to expose desired conductive surfaces (e.g., grounding contacts). The process may then include remasking the PCB with a silicon shield to limit where the conductive layer may be applied (e.g., the conductive layer may only need to be applied to the grounding contacts and on the applied Parylene).

After remasking, the process may include disposing the conductive layer on the PCB in a vacuum environment (e.g., in a PVD vacuum chamber). In some embodiments, prior to disposing the conductive layer onto the PCB, the process may include treating the PCB with Argon and/or Helium plasma for approximately 30 seconds to 1 minute at 600 w. The plasma treatment may be applied generally to the PCB, and not only locally applied. Subsequently, the process may include disposing the conductive layer. For example, the process may include first applying a 100 nm thick layer of chrome to the areas to be conductively coupled. This first layer of chrome may have a range of 100-200 nm in thickness. Subsequently, the process may include applying a 350 nm thick layer of copper on the layer of chrome. This layer of copper may have a range of 350-500 nm in thickness. Finally, the process may include applying another layer of 100 nm thick chrome on the layer of copper to finalize the disposing of the conductive layer. This layer of chrome may have a range of 100-200 nm in thickness. In some embodiments, the process may include further applying an optional layer of Parylene on the conductive layer to provide more structural integrity to the conformal EMI shield.

In some embodiments, board to board connectors on the PCB may include silicone plugs that may act as masks, and that may be removed after CVD coating. For example, only the pins of a subscriber identity module (SIM) connector of the PCB may be masked (e.g., while a dummy card is inserted).

In some embodiments, an alternative to Parylene (e.g., Parylene variants, acrylated polymers or variants, etc.) may be used to form the insulating layer of a conformal EMI shield, and PVD applied material may be used for the conductive layer. For example, alternative coating (e.g., Semblant's SC07-45, SC07-120, etc.), which may also be fluorinated (e.g., CVD applied fluorinated polymer), may be used. The alternative coating may, for example, involve a process of converting monomers directly to polymers. The long chain property of the alternative coating may provide for thinner insulating layers, better adhesion to the PCB and to the conductive layer, higher quality and faster coating, and may be hydrophobic, which may assist in resisting corrosion. For example, a lower pressure and thickness of the alternative coating may make it less likely that a mask will be interfered during application of the alternative coating. In these embodiments, a process similar to process 200 may also be used to provide a conformal EMI shield.

Such a process may include processing a PCB. For example, the process may include applying Kapton, silicone, and/or vacuum friendly tape to mask components and areas of the PCB not to be shielded. As another example, the process may include spraying Silane (e.g., Momentive Silquest A-174NT) onto the PCB, and then dispensing or applying silicone to mask the areas not to be shielded. The mask may be applied manually or using an X-Y table.

The process may also include applying an insulating layer. For example, the process may include applying the alternative coating via CVD onto the processed PCB (e.g., in a vacuum environment).

For example, the process may include applying alternative coating gas, liquid, and/or a combination of gas and liquid precursors (e.g., each having high or low molecular weights) to the masked PCB. In some embodiments, a minimum of 1.5 microns (or between 1.5 and 5 microns (e.g., 2.5 microns)) of the alternative coating may be applied. A CVD vacuum chamber (e.g., a $10^{-3}$ Tor vacuum) may also be employed as part of the applying.

The process may also include demasking the PCB to expose desired conductive surfaces (e.g., grounding contacts). The process may then include remasking the PCB with a silicon shield to limit where the conductive layer may be applied (e.g., the conductive layer may only need to be applied to the grounding contacts and on the applied alternative coating).

After remasking, the process may include disposing the conductive layer on the PCB in a vacuum environment (e.g., in a PVD vacuum chamber). In some embodiments, prior to disposing the conductive layer onto the PCB, the process may include treating the PCB with Argon and/or Helium plasma for approximately 30 seconds to 1 minute at 600 w. The plasma treatment may be applied generally to the PCB, and not only locally applied. Subsequently, the process may include disposing the conductive layer. For example, the process may include first applying a 100 nm thick layer of chrome to the areas to be conductively coupled. This first layer of chrome may have a range of 100-200 nm in thickness. Subsequently, the process may include applying a 350 nm thick layer of copper on the layer of chrome. This layer of copper may have a range of 350-500 nm in thickness. Finally, the process may include applying another layer of 100 nm thick chrome on the layer of copper to finalize the disposing of the conductive layer. This layer of chrome may have a range of 100-200 nm in thickness. In some embodiments, the process may include further applying an optional layer of the alternative coating and/or Parylene on the conductive layer to provide more structural integrity to the conformal EMI shield.

In some embodiments, Parylene may be used to form the insulating layer of a conformal EMI shield, and inkjet printing deposits may be used to form the conductive layer. In these embodiments, a process similar to process 200 may be used to provide a conformal EMI shield.

Such a process may include processing a PCB. For example, the process may include applying Kapton, silicone, and/or vacuum friendly tape to mask components and areas of the PCB not to be shielded. As another example, the process may include spraying Silane (e.g., Momentive Silquest A-174NT) onto the PCB, and then dispensing or applying silicone to mask the areas not to be shielded. The mask may be applied manually or using an X-Y table.

The process may also include applying an insulating layer. For example, the process may include applying Parylene via CVD onto the processed PCB (e.g., in a vacuum environment). For example, the process may include applying Parylene gas, liquid, and/or a combination of gas and liquid precursors (e.g., each having high or low molecular weights) to the masked PCB. In some embodiments, a minimum of 5 microns (or between 5 and 25 microns) of Parylene may be applied. The application of Parylene may take approximately 30 minutes to 4 hours, for example. A CVD vacuum chamber (e.g., a $10^{-5}$ Tor vacuum) may also be employed as part of the applying.

The process may also include demasking the PCB to expose desired conductive surfaces (e.g., grounding contacts). Because inkjet printing may be precisely and locally applied, no remasking of the PCB may be required.

Prior to disposing the conductive layer onto the PCB, the process may include treating the PCB with UV ozone for approximately 8 minutes. For example, a wand or a similar tool may be used to apply the UV ozone to the areas where the conductive layer will be applied. Subsequently, the process may include printing ink via inkjet printing onto desired surfaces of the PCB. The PCB may be moved (e.g., manually or automatically) in any suitable manner (e.g., in a three-dimensional (3D) manner, in any suitable direction toward or away from an inkjet printing apparatus, etc.) during the printing of the ink in order to achieve a conductive layer of suitable thickness. Because the ink may include metal (e.g., silver) that may be surrounded by plastic, the printed ink may be cured to melt the plastic component away, and the resulting deposit may be metal that may have a thickness in the range of 0.5 to 1.5 microns.

Curing of the printed ink may employ any suitable technique. As an example, the process may include curing the printed ink for approximately 30 minutes at approximately 130 degrees Celsius. As another example, the process may include curing the printed ink via UV flash, followed by a heat cure. As yet another example, the process may include curing the printed ink using heat, and then UV flashing.

In some embodiments, an optional layer of Parylene may further be applied on the conductive layer to provide more structural integrity to the conformal EMI shield.

Figure 7:
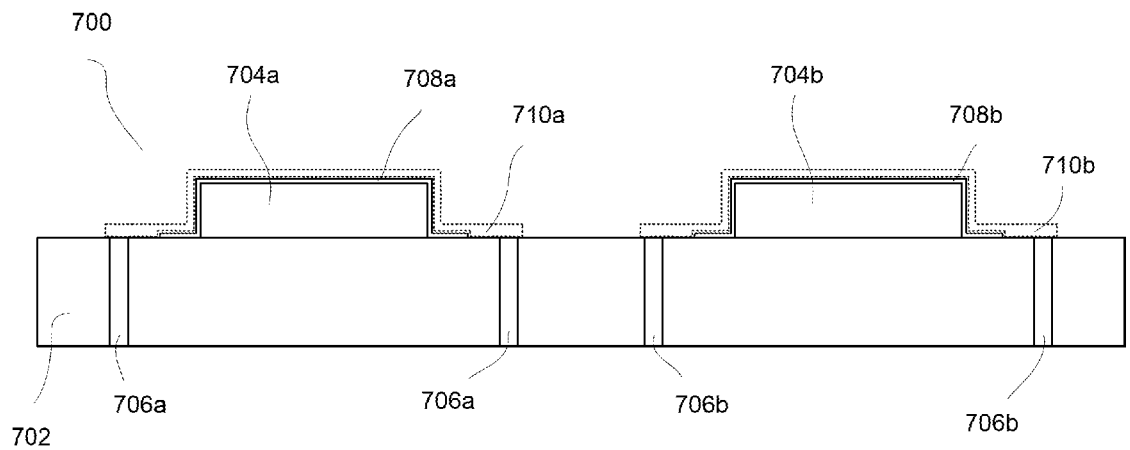
FIG. 7 shows an illustrative system having a patterned conformal EMI shield in accordance with an embodiment.

In some embodiments, inkjet printing may be employed to apply a conductive layer to a PCB. In particular, high resolution capabilities of inkjet printing may allow for patterned shields to be printed. FIG. 7 shows an illustrative system having a patterned conformal EMI shield in accordance with an embodiment. System 700 may be similar to system 100, but may include distinct conductive layers applied or disposed on the PCB in a predefined manner. For example, system 700 may include PCB 702 having circuit components 704a and 704b and grounding contacts 706a and 706b. Grounding contacts 706a may be disposed along a perimeter of circuit component 704a and grounding contacts 706b may be disposed along a perimeter of circuit component 704b. Insulating layer 708a may be disposed on circuit component 704a within the perimeter of grounding contacts 706a and insulating layer 708b may be disposed on circuit component 704b within the perimeter of grounding contacts 706b. Though not shown, in some embodiments, insulating layers 708a and 708b may be part of the same layer and may be applied onto circuit components 704a and 704b as a single insulating layer, but where portions of it may be removed (e.g., portions that may have been applied onto grounding contacts 706a and 706b). Additionally, system 700 may also include distinct conductive layers 710a and 710b that may be constructed of inkjet printing deposits that may each be applied to circuit components 704a and 704b (e.g., on insulating layers 708a and 708b), respectively, as part of an inkjet printing process.

Figure 8:
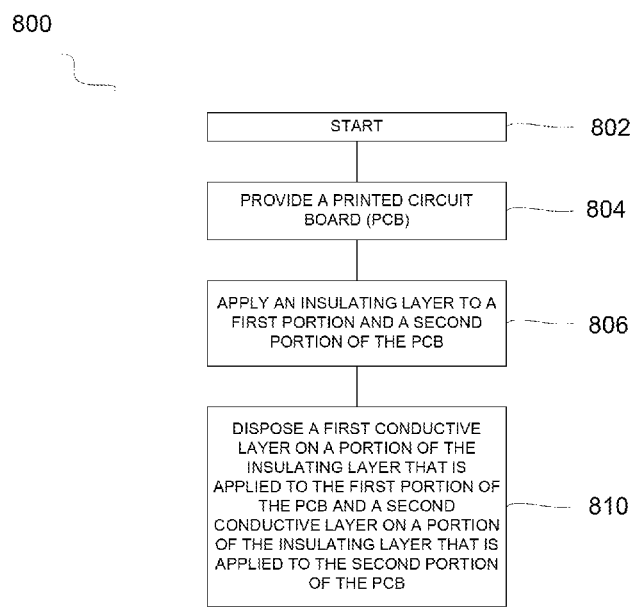
FIG. 8 shows an illustrative process for conformal shielding a PCB in a pattern in accordance with an embodiment.

FIG. 8 shows an illustrative process for conformal shielding a PCB in a pattern in accordance with an embodiment. Process 800 may begin at step 802. At step 804, the process may include applying an insulating layer to a first portion and a second portion of a PCB. For example, step 804 may include applying insulating layers 408a and 408b to circuit components 404 and 404b of PCB 402, respectively. In some embodiments, step 804 may include applying insulating layers 408a and 408b onto circuit components 404a and 404b as a single insulating layer, but where portions of the applied insulating layers 408a and 408b may be removed (e.g., portions that may have been applied onto grounding contacts 406a and 406b).

At step 806, the process may include disposing a first conductive layer on a portion of the insulating layer that is applied to the first portion of the PCB and disposing a second conductive layer on a portion of the insulating layer that is applied to the second portion of the PCB. For example, step 806 may include controlling (e.g., manually or automatically) an inkjet printing apparatus to perform printing of conductive inkjet deposits over insulating layers 408a and 408b and grounding contacts 406a and 406b. That is, conductive layers 410a and 410b may be inkjet printed over insulating layers 408a and 408b and grounding contacts 406a and 406b according to their respective positions on PCB 402. In this manner, regardless of where circuit components and grounding contacts may be positioned on the PCB, an inkjet printing process can be controlled to apply conformal EMI shields accordingly.

Though not shown, it should be appreciated that insulating layer adhesives and conductive layer adhesives may also be applied (or created via suitable treatment) prior to applying the insulating layer and conductive layers, respectively.

In some embodiments, a pattern shield may be deposited in a very fine grid. For example, a conductive epoxy may be deposited in a dispensing machine (e.g., Speedline dispensing machine) or underfil machine.

Figure 9:
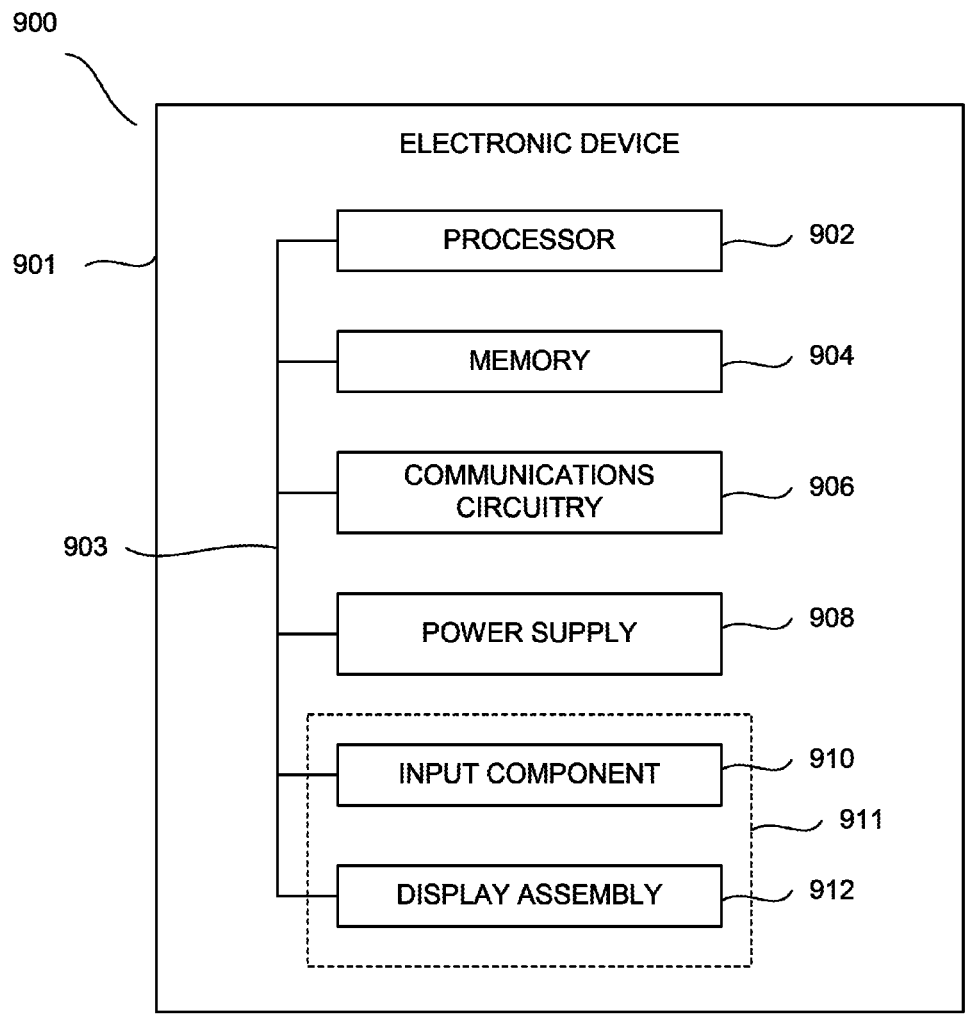
FIG. 9 is a schematic view of an illustrative electronic device in accordance with an embodiment.

FIG. 9 is a schematic view of an illustrative electronic device in accordance with an embodiment. Electronic device 900 may be any portable, mobile, or hand-held electronic device configured to present visible information on a display assembly wherever the user travels. Alternatively, electronic device 900 may not be portable at all, but may instead be generally stationary. Electronic device 900 can include, but is not limited to, a music player, video player, still image player, game player, other media player, music recorder, movie or video camera or recorder, still camera, other media recorder, radio, medical equipment, domestic appliance, transportation vehicle instrument, musical instrument, calculator, cellular telephone, other wireless communication device, personal digital assistant, remote control, pager, computer (e.g., desktop, laptop, tablet, server, etc.), monitor, television, stereo equipment, set up box, set-top box, boom box, modem, router, keyboard, mouse, speaker, printer, and combinations thereof. In some embodiments, electronic device 900 may perform a single function (e.g., a device dedicated to displaying image content) and, in other embodiments, electronic device 900 may perform multiple functions (e.g., a device that displays image content, plays music, and receives and transmits telephone calls).

Electronic device 900 may include a housing 901, a processor or control circuitry 902, memory 904, communications circuitry 906, power supply 908, input component 910, and display assembly 912. Electronic device 900 may also include a bus 903 that may provide a data transfer path for transferring data and/or power, to, from, or between various other components of device 900. In some embodiments, one or more components of electronic device 900 may be combined or omitted. Moreover, electronic device 900 may include other components not combined or included in FIG. 9. For the sake of simplicity, only one of each of the components is shown in FIG. 1.

Memory 904 may include one or more storage mediums, including for example, a hard-drive, flash memory, permanent memory such as read-only memory ("ROM"), semi-permanent memory such as random access memory ("RAM"), any other suitable type of storage component, or any combination thereof. Memory 904 may include cache memory, which may be one or more different types of memory used for temporarily storing data for electronic device applications. Memory 904 may store media data (e.g., music, image, and video files), software (e.g., for implementing functions on device 900), firmware, preference information (e.g., media playback preferences), lifestyle information (e.g., food preferences), exercise information (e.g., information obtained by exercise monitoring equipment), transaction information (e.g., information such as credit card information), wireless connection information (e.g., information that may enable device 900 to establish a wireless connection), subscription information (e.g., information that keeps track of podcasts or television shows or other media a user subscribes to), contact information (e.g., telephone numbers and e-mail addresses), calendar information, any other suitable data, or any combination thereof.

Communications circuitry 906 may be provided to allow device 900 to communicate with one or more other electronic devices or servers using any suitable communications protocol. For example, communications circuitry 906 may support Wi-Fi™ (e.g., an 802.11 protocol), Ethernet, Bluetooth™, high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), hypertext transfer protocol ("HTTP"), BitTorrent™, file transfer protocol ("FTP"), real-time transport protocol ("RTP"), real-time streaming protocol ("RTSP"), secure shell protocol ("SSH"), any other communications protocol, or any combination thereof. Communications circuitry 906 may also include circuitry that can enable device 900 to be electrically coupled to another device (e.g., a computer or an accessory device) and communicate with that other device, either wirelessly or via a wired connection.

Power supply 908 may provide power to one or more of the components of device 900. In some embodiments, power supply 908 can be coupled to a power grid (e.g., when device 900 is not a portable device, such as a desktop computer). In some embodiments, power supply 908 can include one or more batteries for providing power (e.g., when device 900 is a portable device, such as a cellular telephone). As another example, power supply 908 can be configured to generate power from a natural source (e.g., solar power using one or more solar cells).

One or more input components 910 may be provided to permit a user to interact or interface with device 900. For example, input component 910 can take a variety of forms, including, but not limited to, a track pad, dial, click wheel, scroll wheel, touch screen, one or more buttons (e.g., a keyboard), mouse, joy stick, track ball, and combinations thereof. For example, input component 910 may include a multi-touch screen. Each input component 910 can be configured to provide one or more dedicated control functions for making selections or issuing commands associated with operating device 900.

Electronic device 900 may also include one or more output components that may present information (e.g., textual, graphical, audible, and/or tactile information) to a user of device 900. An output component of electronic device 900 may take various forms, including, but not limited, to audio speakers, headphones, audio line-outs, visual displays, antennas, infrared ports, rumblers, vibrators, or combinations thereof.

For example, electronic device 900 may include display assembly 912 as an output component. Display 912 may include any suitable type of display or interface for presenting visible information to a user of device 900. In some embodiments, display 912 may include a display embedded in device 900 or coupled to device 900 (e.g., a removable display). Display 912 may include, for example, a liquid crystal display ("LCD"), a light emitting diode ("LED") display, an organic light-emitting diode ("OLED") display, a surface-conduction electron-emitter display ("SED"), a carbon nanotube display, a nanocrystal display, any other suitable type of display, or combination thereof. Alternatively, display 912 can include a movable display or a projecting system for providing a display of content on a surface remote from electronic device 900, such as, for example, a video projector, a head-up display, or a three-dimensional (e.g., holographic) display. As another example, display 912 may include a digital or mechanical viewfinder. In some embodiments, display 912 may include a viewfinder of the type found in compact digital cameras, reflex cameras, or any other suitable still or video camera.

It should be noted that one or more input components and one or more output components may sometimes be referred to collectively as an I/O interface (e.g., input component 910 and display 912 as I/O interface 911). It should also be noted that input component 910 and display 912 may sometimes be a single I/O component, such as a touch screen that may receive input information through a user's touch of a display screen and that may also provide visual information to a user via that same display screen.

Processor 902 of device 900 may control the operation of many functions and other circuitry provided by device 900. For example, processor 902 may receive input signals from input component 910 and/or drive output signals to display assembly 912. Processor 902 may load a user interface program (e.g., a program stored in memory 904 or another device or server) to determine how instructions or data received via an input component 910 may manipulate the way in which information is provided to the user via an output component (e.g., display 912). For example, processor 902 may control the viewing angle of the visible information presented to the user by display 912 or may otherwise instruct display 912 to alter the viewing angle.

Electronic device 900 may also be provided with a housing 901 that may at least partially enclose one or more of the components of device 900 for protecting them from debris and other degrading forces external to device 900. In some embodiments, one or more of the components may be provided within its own housing (e.g., input component 910 may be an independent keyboard or mouse within its own housing that may wirelessly or through a wire communicate with processor 902, which may be provided within its own housing). All or a portion of housing 901 can be finished, for example, to have an anodized electroplated aluminum finish according to embodiments.

The described embodiments are presented for the purpose of illustration and not of limitation.

What is claimed is:

1. A method of forming a conformal electromagnetic interference (EMI) shield, the method comprising:
    applying a mask to cover a portion of a printed circuit board (PCB), the PCB having one or more circuit components, wherein the portion of the PCB comprises a plurality of grounding contacts, wherein the portion surrounds one or more of the circuit components, and wherein the portion is spaced a minimum predefined distance from an outer surface of any circuit component immediately adjacent to the portion;
    applying an insulating layer to the entire PCB;
    removing the mask, wherein removing the mask further comprises removing portions of the insulating layer applied on the mask;
    treating at least one of the applied insulating layer and the portion for conductive layer adhesion; and
    disposing a conductive layer onto the treated at least one of the applied insulating layer and the portion.

2. The method of claim 1, wherein the plurality of grounding contacts comprises at least one of pads and vias.

3. The method of claim 1, wherein the treating comprises forming a conductive layer adhesive on the at least one of the applied insulating layer and the portion.

4. The method of claim 1, wherein:
    the disposing comprises physical vapor deposition (PVD); and
    the treating comprises treating the at least one of the applied insulating layer and the portion with plasma.

5. The method of claim 1, wherein:
    the conductive layer comprises a foil; and
    the treating comprises treating the at least one of the applied insulating layer and the portion with solder.

6. The method of claim 1, wherein:
    the treating comprises treating only the portion; and
    the disposing comprises coupling the conductive layer to the treated portion.

7. The method of claim 1, wherein:
the treating comprises treating each of the applied insulating layer and the portion; and
the disposing comprises disposing the conductive layer onto both of the treated insulating layer and the treated portion.

8. The method of claim 1, wherein:
the treating comprises treating each of the applied insulating layer and the portion; and
the disposing comprises disposing the conductive layer only onto the treated insulating layer and the treated portion.

9. The method of claim 1, wherein:
the insulating layer comprises CVD Parylene; and
the conductive layer comprises inkjet printing.

10. The method of claim 1, wherein:
the insulating layer comprises CVD Parylene; and
the conductive layer comprises PVD.

11. The method of claim 1, wherein:
the insulating layer comprises CVD Parylene; and
the conductive layer comprises dispensed ink.

12. A method of forming a conformal electromagnetic interference (EMI) shield, the method comprising:
processing portions of a printed circuit board (PCB) for insulating layer adhesion, the PCB having one or more circuit components and a perimeter of grounding contacts;
applying an insulating layer to the processed portions;
treating at least one of the applied insulating layer and the perimeter for conductive layer adhesion; and
disposing a conductive layer onto the treated at least one of the applied insulating layer and the perimeter, wherein:
the insulating layer comprises at least one of potting material and coating material; and
the processing comprises treating areas of the PCB other than the perimeter with plasma.

13. A method of forming a conformal electromagnetic interference (EMI) shield, the method comprising:
processing portions of a printed circuit board (PCB) for insulating layer adhesion, the PCB having one or more circuit components and a perimeter of grounding contacts;
applying an insulating layer to the processed portions;
treating at least one of the applied insulating layer and the perimeter for conductive layer adhesion; and
disposing a conductive layer onto the treated at least one of the applied insulating layer and the perimeter, wherein:
the insulating layer comprises chemical vapor deposition (CVD) Parylene; and
the processing comprises applying silicon to areas of the PCB other than the perimeter.

14. A method of forming a conformal electromagnetic interference (EMI) shield, the method comprising:
processing portions of a printed circuit board (PCB) for insulating layer adhesion, the PCB having one or more circuit components and a perimeter of grounding contacts;
applying an insulating layer to the processed portions;
treating at least one of the applied insulating layer and the perimeter for conductive layer adhesion; and
disposing a conductive layer onto the treated at least one of the applied insulating layer and the perimeter, wherein:
the conductive layer comprises inkjet printing deposits; and
the treating comprises treating the at least one of the applied insulating layer and the perimeter with UV ozone material.

15. A method of forming a conformal electromagnetic interference (EMI) shield, the method comprising:
applying adhesive to portions of a printed circuit board, the printed circuit board having one or more circuit components and a perimeter portion that contains a plurality of grounding contacts, wherein the perimeter portion surrounds the one or more circuit components, wherein applying adhesive to portions of the printed circuit board comprises only applying adhesive to portions of the printed circuit board that are interposed between the one or more circuit components and the perimeter portion;
applying adhesive over the one or more circuit components;
applying an insulating layer to the printed circuit board such that the insulating layer is adhered to both the printed circuit board and the one or more circuit components, wherein the perimeter is uncovered by the insulating layer;
treating only the perimeter portion for conductive layer adhesion; and
disposing a conductive layer onto the insulating layer and the perimeter portion.

* * * * *